United States Patent
Raberg et al.

(10) Patent No.: US 10,852,369 B2
(45) Date of Patent: Dec. 1, 2020

(54) STRAY FIELD ROBUST XMR SENSOR USING PERPENDICULAR ANISOTROPY

(71) Applicant: Infineon Technologies AG, Neubiberg (DE)

(72) Inventors: Wolfgang Raberg, Sauerlach (DE); Clemens Muehlenhoff, Munich (DE); Juergen Zimmer, Neubiberg (DE)

(73) Assignee: Infineon Technologies AG

( * ) Notice: Subject to any disclaimer, the term of this patent is extended or adjusted under 35 U.S.C. 154(b) by 151 days.

(21) Appl. No.: 16/243,450

(22) Filed: Jan. 9, 2019

(65) Prior Publication Data

US 2020/0217907 A1    Jul. 9, 2020

(51) Int. Cl.
*G01R 33/09* (2006.01)
*H01L 43/02* (2006.01)
*H01L 43/10* (2006.01)
*H01F 10/32* (2006.01)
*G01D 5/16* (2006.01)

(52) U.S. Cl.
CPC .............. *G01R 33/093* (2013.01); *G01D 5/16* (2013.01); *H01F 10/3254* (2013.01); *H01F 10/3286* (2013.01); *H01L 43/02* (2013.01); *H01L 43/10* (2013.01)

(58) Field of Classification Search
CPC ........ G01R 33/00; G01R 33/02; G01R 33/06; G01R 33/09; G01R 33/093; G01D 5/00; G01D 5/12; G01D 5/14; G01D 5/16; H01L 43/00; H01L 43/02; H01L 43/10; H01F 10/00; H01F 10/32; H01F 10/324; H01F 10/3254; H01F 10/3286

USPC ......... 324/200, 244, 252, 260; 257/414, 421
See application file for complete search history.

(56) References Cited

U.S. PATENT DOCUMENTS

| | | | | |
|---|---|---|---|---|
| 8,406,045 | B1* | 3/2013 | Chen | G11C 11/161 365/173 |
| 9,722,175 | B2* | 8/2017 | Lei | G01B 7/30 |
| 10,718,830 | B2* | 7/2020 | Ferreira | H01F 10/3272 |
| 2007/0063690 | A1* | 3/2007 | De Wilde | G11C 11/1675 324/117 R |
| 2010/0271870 | A1* | 10/2010 | Zheng | G11C 11/161 365/171 |
| 2013/0027031 | A1* | 1/2013 | Dimitrov | G01R 33/093 324/252 |
| 2013/0113058 | A1* | 5/2013 | Fukami | H01L 43/08 257/421 |

(Continued)

OTHER PUBLICATIONS

Butler, W. H., "Tunneling Magnetoresistance From a Symmetry Filtering Effect." Science and Technology of Advanced Materials, Printed in the UK, Mar. 2008, pp. 1-17.

*Primary Examiner* — Hoai-An D. Nguyen
(74) *Attorney, Agent, or Firm* — Design IP

(57) ABSTRACT

A magnetoresistive sensor has a sensor plane in which the magnetoresistive sensor is sensitive to a magnetic field. The magnetoresistive sensor includes a reference layer having a reference magnetization that is fixed and that is aligned with an in-plane axis of the sensor plane; and a magnetic free layer disposed proximate to the reference layer, the magnetic free layer having a free layer magnetization aligned along an out-of-plane axis that is out-of-plane to the sensor plane. The free layer magnetization is configured to tilt away from the out-of-plane axis and towards the sensor plane in a presence of an external in-plane magnetic field.

20 Claims, 4 Drawing Sheets

(56) References Cited

U.S. PATENT DOCUMENTS

| | | | |
|---|---|---|---|
| 2013/0168787 A1* | 7/2013 | Shen | G01R 33/098 257/421 |
| 2014/0124882 A1* | 5/2014 | Khalili Amiri | H01L 43/10 257/421 |
| 2015/0185297 A1 | 7/2015 | Zimmer et al. | |
| 2017/0330070 A1* | 11/2017 | Sengupta | G06F 7/48 |
| 2018/0238711 A1 | 8/2018 | Zimmer | |

* cited by examiner

STRAY FIELD ROBUST XMR SENSOR USING PERPENDICULAR ANISOTROPY

FIELD

The present disclosure relates generally to a magnetoresistive sensor device and to methods for manufacturing the same, and, more particularly, to a magnetoresistive sensor device that uses perpendicular anisotropy.

BACKGROUND

Magnetoresistive effects are based on numerous different physical phenomena. All of these phenomena have in common that an electrical resistance of a resistive element is alterable by a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based magnetoresistive sensors, for example, for measuring revolution, angles, etc.

xMR sensors, and in particular xMR angle sensors, should exhibit a sensor layer (free layer) being capable of ideally following the direction of an external rotating magnetic field. Due to their high signal and high accuracy, and the possibility to integrate xMR sensors in a modular way onto complementary metal—oxide—semiconductor (CMOS) and bipolar-CMOS (BiCMOS) technologies, they are often the preferred choice over Hall based angle sensors. However, these xMR sensors suffer from two distinct drawbacks: a reduced accuracy at low fields due to anisotropy effects and susceptibility to disturbance fields.

xMR based angle sensors typically consist of a system of at least two full Wheatstone bridges which, in the case of GMR and TMR, provide a sine or a cosine signal using the applied magnetic field. This field is typically provided by a permanent magnet and the sensitive layer in each resistor of the Wheatstone bridges is operating in a fully saturated mode. The magnetization of this sensitive layer is fully aligned "in-plane" with the external field. However, if the external field is small, anisotropies of various origin may cause deviations from the full alignment resulting in inaccuracies of the angle measurement, i.e., leading to an increased angle error in a presence of a low external field. To avoid this, encoder magnets with a minimum field strength may be used with these types of sensors, which is typically synonymous with increased cost.

An output signal of such a sensor with a FL operating in saturated mode is not capable of measuring a field strength of an external magnetic field (i.e., B-field). Thus, the output signal only depends on the rotational orientation of an external B-field and not on its field strength. As a result, a sensor operating in saturated mode has no way of determining whether the external field is purely generated by the encoder magnet or whether a superposed external disturbance field is present. This again leads to an inaccurate angle measurement. To overcome this problem the system either has to be shielded against external fields or a stronger magnet needs to be used in order to reduce the influence of the disturbance field.

In another example, a linear xMR based sensor element is used that is capable of measuring the strength of an in-plane magnetic field by means of a structure exhibiting a closed-flux magnetization of the sensor layer (e.g., a vortex-like magnetization). The measurement range can be adjusted by the lateral structure size (i.e., a diameter in the case of a circular structure) and/or by the thickness of the sensor layer. The smaller the shape size and the higher the sensor layer thickness, the higher the upper field limit is. Usually, a so-called annihilation field (field, where the closed-flux magnetization is annihilated) of up to ~100 mT can be reached. From a lithography and process point-of-view, the structure size has a lower limit. Therefore, a further extension is hardly possible. As a result, an angle sensor based on a closed-flux magnetized sensor layer can only be used for rotating B-fields of <<100 mT which is below some of today's requirements.

Consequently, there is a need for another solution for a field strength sensing element being capable for angle measurements up to 100 mT at high accuracy.

Therefore, an improved device that addresses these issues without compromising the advantages of the xMR-technology may be desirable.

SUMMARY

Embodiments provide a magnetoresistive sensor device that is robust against stray fields by using perpendicular anisotropy.

According to an embodiment, a magnetoresistive sensor has a sensor plane in which the magnetoresistive sensor is sensitive to a magnetic field. The magnetoresistive sensor includes a reference layer having a reference magnetization that is fixed and that is aligned with an in-plane axis of the sensor plane; and a magnetic free layer disposed proximate to the reference layer, the magnetic free layer having a free layer magnetization aligned along an out-of-plane axis that is out-of-plane to the sensor plane. The free layer magnetization is configured to tilt away from the out-of-plane axis and towards the sensor plane in a presence of an external in-plane magnetic field.

According to another embodiment, a magnetoresistive sensor having a sensor plane in which the magnetoresistive sensor is sensitive to an external in-plane magnetic field is provided. The magnetoresistive sensor includes a first sensor arrangement and a second sensor arrangement. The first sensor arrangement includes a first plurality of sensor elements, where each of the first plurality of sensor elements include a first reference layer having a first reference magnetization that is fixed and that is aligned with a first in-plane axis of the sensor plane; and a first magnetic free layer disposed proximate to the first reference layer, the first magnetic free layer having a first free layer magnetization aligned along an out-of-plane axis. The second sensor arrangement includes a second plurality of sensor elements, where each of the second plurality of sensor elements includes a second reference layer having a second reference magnetization that is fixed and that is aligned with a second in-plane axis of the sensor plane, where the second in-plane axis is perpendicular to the first in-plane axis; and a second magnetic free layer disposed proximate to the second reference layer, the second magnetic free layer having a second free layer magnetization aligned along the out-of-plane axis.

BRIEF DESCRIPTION OF THE DRAWINGS

Embodiments are described herein making reference to the appended drawings.

DETAILED DESCRIPTION

Figure 1:
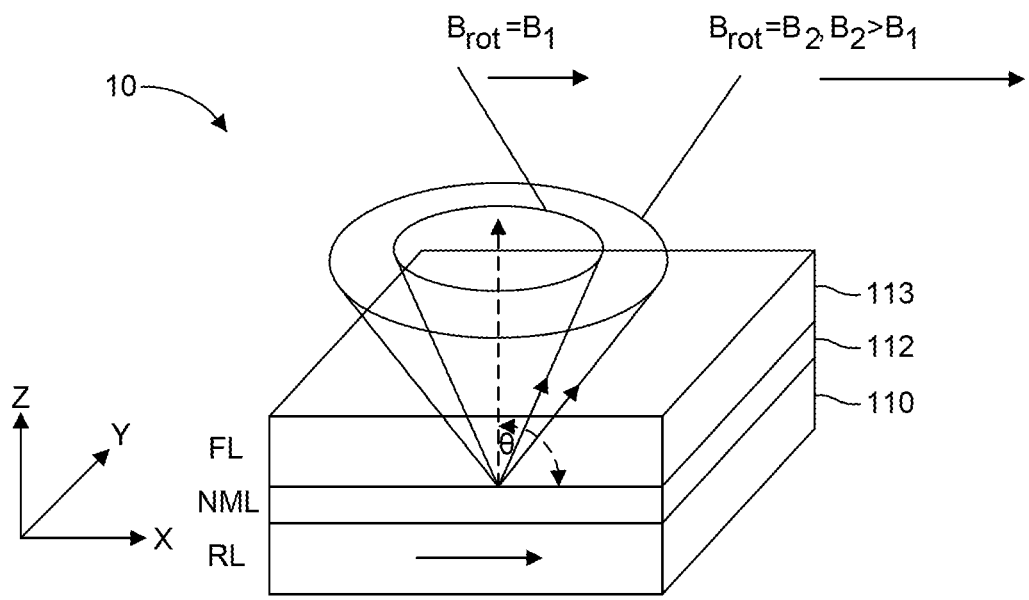
FIG. 1 shows a cross section of a spin-valve GMR/TMR structure according to one or more embodiments.

In the following, various embodiments will be described in detail referring to the attached drawings. These embodiments are given for illustrative purposes only and are not to be construed as limiting. For example, while embodiments may be described as comprising a plurality of features or elements, in other embodiments, some of these features or elements may be omitted, and/or may be replaced by alternative features or elements. In other embodiments, further features or elements in addition to those explicitly shown or described may be provided. In addition, features of the different embodiments described hereinafter may be combined with each other to form further embodiments, unless specifically noted otherwise. For example, variations or modifications described with respect to one of the embodiments may also be applicable to other embodiments unless noted to the contrary.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes," and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. Functional blocks may be implemented in hardware, firmware, software, or a combination thereof.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. A sensor device, as described herein, may be an angle sensor, a linear position sensor, a speed sensor, motion sensor, and the like.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

It will be appreciated that the terms "sensor" and "sensing element" may be used interchangeably throughout this description, and the terms "sensor signal" and "measurement signal" may also be used interchangeably throughout this description.

Magnetic sensors, as provided herein, may be magnetoresistive sensors. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current (i.e., sensing axis) and direction of magnetization is observed. For example, in the case of AMR sensors, a resistance for an AMR sensor element changes according to a square of a sine of an angle of the magnetic field component projected on a sensing axis the AMR sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction in the case of GMR or TMR technology). The reference magnetization is a magnetization direction that provides a sensing direction corresponding to a sensing axis of the xMR sensor. The reference layer, and consequently the reference magnetization, defines a sensor plane. For example, the sensor plane may be defined by an XY plane, where the Z-axis is perpendicular to the sensor plane. Thus, the X and Y-directions are referred to as "in-plane" with respect to the sensor plane and the Z-direction is referred to as "out-of-plane" with respect to the sensor plane in this example.

Accordingly, in the case for a GMR or a TMR sensor element, if a magnetic field component (e.g., a free layer) points exactly in the same direction as the reference direction, a resistance of the xMR sensor element is at a minimum, and, if a magnetic field component points exactly in the opposite direction as the reference direction, the resistance of the xMR sensor element is at a maximum. A magnetic field component may be, for example, an x-magnetic field component (Bx), a y-magnetic field component (By), or a z-magnetic field component (Bz), where the Bx and By field components are in-plane to the magnetic sensor, and Bz is out-of-plane to the magnetic sensor.

The magnetic free layer (MFL) for an xMR sensor may be made from a nickel-iron (NiFe) alloy, a cobalt-iron (CoFe) alloy, a terbium-iron-cobalt (TbFeCo) alloy, or a combination of two or more different layers may be used in a bi-layer or multi-layer arrangement where two or more magnetic free layers are used. As used herein, a "bi-layer" refers to two adjacently disposed layers that make up a layer system, and a "multi-layer" refers to two or more adjacently disposed layers that make up a layer system. In one example, a multi-layer MFL may be comprised of two layers of CoFeB with a tantalum (Ta) layer interposed between the two CoFeB layers (e.g., CoFeB/Ta/CoFeB).

Other bi-layer systems may also be used, such as platinum (Pt) and cobalt (Co) layers; palladium (Pd) and cobalt (Co) layers; cobalt (Co) and nickel (Ni) layers. In particular, each magnetic free layer may be made of a material selected from cobalt, nickel, iron, platinum, tantalum, palladium, terbium, and alloys thereof. Alloys may comprise non-ferromagnetic materials (e.g., carbon, boron, nitrogen, and/or oxygen) with ferromagnetic materials constituting at least 50% of a material composition of the respective layer. It will be appreciated that while certain materials are listed herein for respective layers or multi-layers, the listed materials only serve as examples and are not to be construed as limiting.

A neighbor layer may constitute a neighbor layer system where a bi-layer next-neighbor layer system is disposed adjacent to one of the magnetic free layers. For example, a next-neighbor system may be a bi-layer made of ruthenium (Ru) and copper (Cu) layers. By varying the thickness ratio of Ru/Cu a magnetoelastic behavior can be changed. The neighbor layers adjacent to the magnetic free layers may have an affect on the degree of perpendicular anisotropy of the magnetic free layers. Therefore, it will be further appreciated that other materials other that Ru and Cu may be used that are suitable such that a perpendicular anisotropy in the magnetic free layers can be realized.

According to one or more embodiments, an xMR layer stack, referred to as a magnetic layer stack, may include a magnetic free layer (MFL) disposed adjacent to at least one non-magnetic layer (NML). A non-magnetic layer adjacent to the magnetic free layer may be referred to as a neighbor layer. The magnetic free layer may be a signal magnetic free layer or may be a magnetic free multi-layer that includes two or more adjacently disposed magnetic free layers. One of the non-magnetic layers may be disposed between the magnetic free layer and a cap layer or a seed layer in a bottom spin value (BSV) or a top spin valve (TSV) arrangement, respectively, whereas another one of the non-magnetic layers may be disposed between the magnetic free layer and the reference layer. Stack systems using double reference systems in which a reference system including its own reference layer is disposed on each side of the free layer or multi-free layer are also possible.

The MFL is configured with a perpendicular anisotropy that is perpendicular to and out-of-plane from the sensor plane. In other words, the MFL is a layer that is magnetized perpendicular to and out-of-plane to the sensor plane (i.e., orthogonal to the reference layer). Without an external magnetic field, the intrinsic magnetic anisotropy affects the MFL magnetization to be aligned along an axis (e.g., the Z-axis) perpendicular the sensor plane. Upon applying an external in-plane magnetic field to the MFL or exposing the MFL to an in-plane magnetic field, the MFL magnetization is tilted into the sensor plane.

For example, the magnetization direction of the MFL may change from its default direction that is aligned perpendicular to the sensor plane (i.e., being aligned the Z-direction or negative Z-direction in the absence of an external in-plane magnetic field) to a direction with an increasing X-direction component when an in-plane magnetic field is applied to the MFL. The tilt direction in which the magnetization direction of the MFL moves may depend on the rotation direction of the applied in-plan magnetic field such that a clockwise rotation direction may cause the magnetization direction of the MFL to change in a positive in-plane direction (e.g., +X-direction) and a counter-clockwise rotation direction may cause the magnetization direction of the MFL to change in a negative in-plane direction (e.g., −X-direction), or vice versa.

If the MFL comprises a multi-layer, each layer of the multi-layer would be configured with perpendicular anisotropy with a magnetization aligned in the same magnetization direction.

As examples, the cap layer may be made of tantalum (Ta) or tantalum-nitride (TaN, whereas the seed layer may be made of a bi-layer of a Ta or TaN layer and a nickel-chromium (NiCr) layer.

Accordingly, the magnetic layer stack may include a first non-magnetic layer; a second non-magnetic layer; and a magnetic free layer disposed between first non-magnetic layer and the second non-magnetic layer In the following, some example implementations of GMR structures are described. However, similar principles may be applied to other types of xMR sensors, such as TMR and the like. GMR structures are often operated in a so-called current-in-plane (CIP) configuration, i.e., the applied current flows in parallel to the layer structure or the chip top surface. The application spectrum for TMR structures is similar to GMR structures. However, compared to GMR structures, TMR structures are often operated in a so-called current-perpendicular-to-plane (CPP) configuration, i.e., the applied current flows perpendicular to the layer structure or the chip top surface.

FIG. 1 shows a cross section of a spin-valve GMR/TMR structure 10 according to one or more embodiments. In particular, the spin-valve GMR/TMR structure 10 is a partial spin-value structure that includes a reference layer (RL) 110, a magnetic free layer (FL) 113, and a non-magnetic layer (NML) 112 interposed between the reference layer 110 and the free layer 113 that may be incorporated in either a full GMR spin-valve structure or a full TMR spin-value structure. The GMR/TMR structure 10 relates to a GMR or TMR sensor with perpendicular anisotropy and an in-plane reference system used as an angle sensor or in general to a sensor being capable of measuring rotating magnetic fields, such as rotational speed sensors.

In this example, the magnetization of the magnetic reference layer 110 is aligned and fixed in a +x-direction, in the sensor plane. The free layer 113 exhibits perpendicular anisotropy with its magnetization aligned in the +z-direction, which is perpendicular to and out-of-plane from the sensor plane.

FIG. 1 shows schematically the trajectory of the FL magnetization when an in-plane rotating magnetic field is applied to a spin-valve GMR/TMR structure 10 where the FL exhibits a perpendicular magnetic anisotropy (PMA). Without an external magnetic field, the intrinsic magnetic anisotropy affects the FL magnetization to be aligned along an axis perpendicular the sensor plane (e.g., along the z-direction). Upon an in-plane magnetic field, the FL magnetization is tilted towards the sensor plane, where the tilt direction of the FL magnetization depends on the direction of one or more in-plane magnetic field components acting on the free layer 113 and where the tilt angle θ of the FL magnetization depends on the magnitude of those one or more in-plane magnetic field components acting on the free layer 113. In other words, the vector of the FL magnetization is configured to pivot from the perpendicular, out-of-plane axis and has an increasing sensor-plane component as it tilts into the sensor plane.

In the case of applying an in-plane field having a magnetic field component along the x-axis, the vector of the FL magnetization is configured to pivot from the perpendicular, out-of-plane axis in the XZ plane and has an increasing sensor-plane component as it tilts into the sensor plane. In a pure Bx field, the vector of the FL magnetization would pivot from the z-axis towards the x-axis.

On the other hand, in the case of applying an in-plane field having a magnetic field component along the y-axis, the vector of the FL magnetization is configured to pivot from the perpendicular, out-of-plane axis in the YZ plane and has an increasing sensor-plane component as it tilts into the sensor plane. In a pure By field, the vector of the FL magnetization would pivot from the z-axis towards the y-axis.

When the in-plane field has both Bx and By magnetic field components (i.e., components along the x-axis and the y-axis), the vector of the FL magnetization is configured to pivot from the perpendicular, out-of-plane axis towards a direction in the sensor plane somewhere between the x-axis and the y-axis. Thus, in the case of a rotating in-plane B-field, as shown in FIG. 1, the FL magnetization performs a movement in a whole half-space as the magnetic field rotates. In other words, the FL magnetization performs a movement along a circumference of a cone as the magnetic field rotates, where one end of the vector is fixed at the cone's vertex and the other end is free to rotate about the cone's circumference. The radius of the cone changes with the magnitude of the magnetic field, and, as a result, the tilt angle θ of the FL magnetization changes accordingly. In summary, the FL magnetization has the rotational trajectory that is representative of a cone in the presence of a rotating in-plane B-field.

The stronger the external field, the stronger the tilt and the greater the tilt angle θ of the FL magnetization is from the perpendicular, out-of-plane axis (i.e., the z-axis). This is demonstrated in FIG. 1 showing two in-plane rotating magnetic fields B1 and B2, where the field strength of field B2 is greater than the field strength of B1 (B2>B1). In this case, the vector of the FL magnetization that is in the presence of field B2 is tilted more strongly away from the perpendicular, out-of-plane axis than the vector of the FL magnetization that is in the presence of field B1. From a different perspective, the vector of the FL magnetization that is in the presence of field B2 is tilted more strongly towards an in-plane axis (e.g., an x-axis) than the vector of the FL magnetization that is in the presence of field B1. In the case that the external field is strong enough, the FL magnetization may be rotated enough about its pivot point to be aligned parallel or anti-parallel to the in-plane axis.

As a result of the free layer 113 having perpendicular anisotropy, the net in-plane FL magnetization component and, therefore, the amplitude of a sinusoidal output signal generated by the sensor element depends on the field strength of an external rotating B-field. Within the linear range (e.g., up to +/−150 mT) the amplitude of the sensor output is directly proportional to the magnetization (i.e., the field strength of the external rotating B-field). Furthermore, by using such a free layer 113, the concept of operating the free layer in saturation is replaced by a field strength measurement. This enables accurate measurement at low fields and the identification of the presence of disturbance fields (e.g., by using a gradiometer-like concept). This is also true in a full angle sensor when the sensor is used in angle sensor mode.

Figure 2:
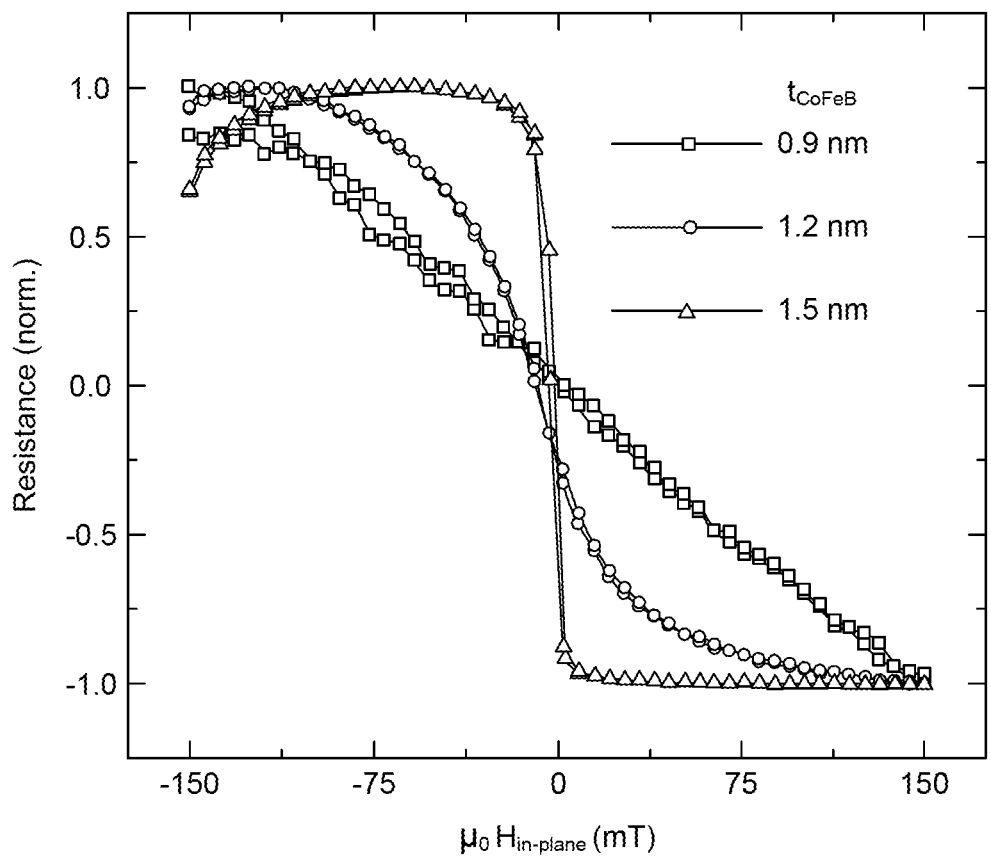
FIG. 2 shows a current-in-plane tunneling (CIPT) measurement showing xMRz sensor resistance with respect to an external magnetic field with in-plane direction.

FIG. 2 shows a current-in-plane tunneling (CIPT) measurement showing xMRz sensor resistance with respect to an external magnetic field with in-plane direction. An xMRz sensor as used herein refers to an xMR sensor having a free layer with perpendicular magnetic anisotropy, in this case, in the z-direction. Shown are three different sensor designs that differ in FL thickness.

According to FIG. 2, the normalized resistances of xMR sensors are plotted with respect to an external magnetic field with in-plane direction. As shown, in a free layer having a thickness of 1.2 nm, the anisotropy starts to become perpendicular. On the other hand, an xMRz sensor with a 0.9 nm free layer thickness yields a linear range of approximately 150 mT.

Perpendicular magnetic anisotropy (PMA) for this design originates from the hybridization of 3d-CoFe orbitals with 2p-O orbitals. Therefore, the materials of sensors with CoFeB—MgO—CoFeB tunnel junctions, corresponding to the materials of the RL 1, NML 3, and FL 2, respectively, can be used. However, the thickness of the free layer may be of importance, as the PMA only appears at the material interface. Free layers comprising of CoFe with a thicknesses above 1.2 nm do not show PMA since the net anisotropy is dominated by the in-plane bulk anisotropy. Thus, the thickness of the free layer 2 may be limited based on its material. For example, a free layer comprising CoFe may be limited to 1.2 nm or less in thickness. It will also be appreciated that using other materials for the free layer may lead to different optimum thicknesses. Thus, examples in which CoFe or CoFeB is used should not be regarded as limiting.

Figure 3:
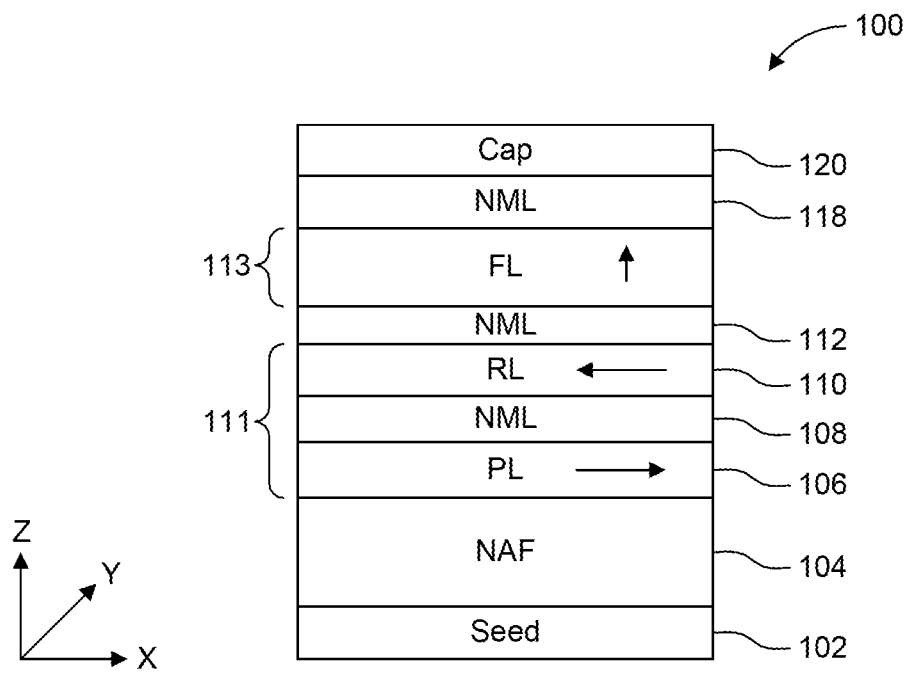
FIG. 3 shows a vertical cross-section of a GMR stack according to one or more embodiments.

FIG. 3 shows a vertical cross-section of a GMR stack according to one or more embodiments. Specifically, the GMR stack in FIG. 3 is arranged in a bottom spin valve (BSV) configuration.

FIG. 3 shows an example of a magnetic layer stack 100 of a magnetoresistive sensor according to an example. For instance, the magnetic layer stack 100 can be arranged on a semiconductor substrate (not shown) of the magnetoresistive sensor. If described in a Cartesian coordinate system with pair-wise perpendicular coordinate axes x, y, and z, the layers each extend laterally in a plane spanned by the x and y axes. Hereinabove, lateral dimensions (e.g., lateral distances, lateral cross sectional areas, lateral areas, lateral extensions, lateral displacements, etc.) refer to dimensions in the xy-plane. Vertical dimensions refer to dimensions in z-direction, perpendicular to the xy-plane. For example, the (vertical) extent of a layer in z-direction may be described as the layer thickness.

From the bottom up, the magnetic layer stack 100 comprises a seed layer 102 used to influence and/or optimize the stack growth. A natural antiferromagnetic (NAF) layer 104 is disposed on the seed layer 102 and a ferromagnetic pinned layer 106 is disposed on the NAF layer 104. The NAF layer 104 may be made of platinum-manganese (PtMn), iridium-manganese (IrMn), nickel-manganese (NiMn), or the like. A film thickness of the NAF can be in the range of 5 nm to 50 nm. The pinned layer (PL) 106 may be made of CoFe, cobalt-iron-boron (CoFeB), or the like.

Contact between the NAF layer 104 and the pinned layer 106 can provoke an effect known as exchange bias effect, causing the magnetization of the pinned layer 106 to align in a preferred direction (e.g., in the x-direction, as shown). The pinned layer 106 can comprise a closed flux magnetization pattern in the xy-plane. This closed flux magnetization pattern of the pinned layer 106 may be generated during manufacturing of the magnetic layer stack 100 and may be permanent. Alternatively, the pinned layer 106 can comprise a linear magnetization pattern in the xy-plane.

The magnetic layer stack 100 further comprises a non-magnetic layer (NML) referred to as coupling layer 108. The coupling layer 108 may be diamagnetic and comprise ruthenium, iridium, copper and/or copper alloys and similar materials, for example. The coupling layer 108 spatially separates the pinned layer 106 from the magnetic (e.g., ferromagnetic) reference layer (RL) 110. The coupling layer 108 can provide an antiferromagnetic Ruderman-Kittel-Kasuya-Yosida (RKKY) coupling to form an artificial antiferromagnet. Thus, using this build-up, the magnetization of the magnetic reference layer 110 may align and be held in a direction anti-parallel to the magnetization of the pinned layer 106 (i.e., in the −x-direction, as shown).

For example, if the pinned layer 106 comprises a clockwise closed flux magnetization pattern in the xy-plane, the magnetic reference layer 110 may comprise a counterclockwise closed flux magnetization pattern in the xy-plane (or vice versa). In this way, the magnetic reference layer 110 can have a permanent closed flux magnetization pattern. Moreover, in case the pinned layer 106 comprises a linear magnetization pattern in the xy-plane into a certain direction, the reference layer 110 may comprise a linear magnetization pattern in an anti-parallel direction. Thus, the pinned layer 106, the coupling layer 108, and the magnetic reference layer 110 forms a magnetic reference system 111. The film thickness for the pinned layer 106 and the reference layer 110, respectively, may be in the range of 1 nm to 100 nm.

The magnetic layer stack 100 additionally comprises a non-magnetic layer 112, referred to as a neighbor layer, and a magnetic free layer 113 having perpendicular magnetic anisotropy. Thus, as similarly shown in FIG. 1, the magnetization of the free layer 113 is aligned along an out-of-plane axis perpendicular to the sensor plane when an external in-plane magnetic field is absent. In this example, the FL magnetization is aligned along the z-axis when an external in-plane magnetic field is absent. Upon applying an in-plane magnetic field, the FL magnetization is tilted into the sensor plane towards an in-plane axis to which the magnetization of the reference layer 110 is aligned (e.g., the x-axis).

The non-magnetic layer 112 may be composed of a non-magnetic material such as copper, silver, magnesium, indium, bismuth, tin, or zinc, and is disposed between the magnetic reference layer 110 and the magnetic free layer 113. The magnetic free layer 113 acts as a sensor layer that changes its magnetization upon an external magnetic in-plane field. The non-magnetic layer 112 is coupled directly to the magnetic free layer without any intermediate layer in-between. In general for GMR and TMR sensors, the non-magnetic layer 112 is where the sensor signal is generated. For GMR sensors, typical materials are conductive, such as Cu and Ag, whereas for TMR sensors insulating tunnel barriers are used, e.g., MgO, $AlO_x$, $MgAlO_x$, hafnium oxide (HfO), etc.

The magnetic free layer 113 may be a multi-layer composed of two or more magnetic free layers each with perpendicular magnetic anisotropy. In this case, the magnetic free layers are magnetically coupled to each other. In one embodiment, this coupling may be a direct coupling without any intermediate layer in-between the free layers. In another embodiment, the coupling may comprise an RKKY coupling with a non-magnetic layer (i.e., a coupling layer) in-between the free layers. Materials of the magnetic free layer or layers can be similar to the alloys of ferromagnetic materials of the pinned layer 106 and the reference layer 110, such as CoFe, CoFeB, and/or NiFe. In particular, each magnetic free layer may be made of a material selected from cobalt, nickel, iron, platinum, tantalum, palladium, terbium, and alloys thereof, or any other suitable material. Alloys may comprise non-ferromagnetic materials (e.g., carbon, boron, nitrogen, and/or oxygen) with ferromagnetic materials constituting at least 50% of a material composition of the respective layer. By using two or more sensor layers in a multi-layer arrangement, a signal amplitude of the xMR sensor may be increased/amplified.

The magnetic layer stack 100 additionally may optionally comprise a non-magnetic layer 118, referred to as a neighbor layer. This neighbor layer may have the most impact on the perpendicular anisotropy of the magnetic free layer 113. The non-magnetic layer 118 may be composed of a non-magnetic material such as copper, magnesium, indium, bismuth, tin, zinc, tantalum, magnesium oxide (MgO), tungsten (W), or any other suitable material. This non-magnetic layer 118 is disposed on the magnetic free layer 113. Thus, the non-magnetic layer 118 is coupled directly to the magnetic free layer without any intermediate layer in-between.

A cap layer 120 made of, for example, tantalum (Ta), tantalum-nitride (TaN), Ru or Pt is disposed on the non-magnetic layer 118 and forms the upper layer of the magnetic layer stack 100.

According to some embodiments, the non-magnetic layer 112 may be electrically conducting (e.g., comprise copper, silver, gold, tungsten, aluminum, and/or alloys thereof). In this case, the magnetoresistive sensor comprising the magnetic layer stack 100 can be a GMR sensor. Alternatively, the non-magnetic layer 112 may be an electrically insulating tunnel barrier layer (e.g., made of aluminium-oxide ($Al_2O_3$) and/or magnesium-oxide (MgO)), as well as other materials noted herein. The magnetoresistive sensor comprising the magnetic layer stack 100 may then be a TMR sensor. Thus, examples of xMR sensors of the present disclosure may comprise the magnetic layer stack 100 of FIG. 3 and/or similar magnetic layer stacks. Magnetoresistive sensors are not limited to the GMR or the TMR effect. Other examples of the present disclosure can comprise structures based on other xMR effects. The magnetic layer stack 100 may correspond to a magnetoresistor as employed by at least some embodiments of this disclosure.

As noted above, FIG. 3 shows a vertical cross section of a first possible stack implementation: the so-called "bottom-pinned spin-valve" structure (BSV), which comprises a NAF layer 104 on the bottom (e.g., substrate) side.

Figure 4:
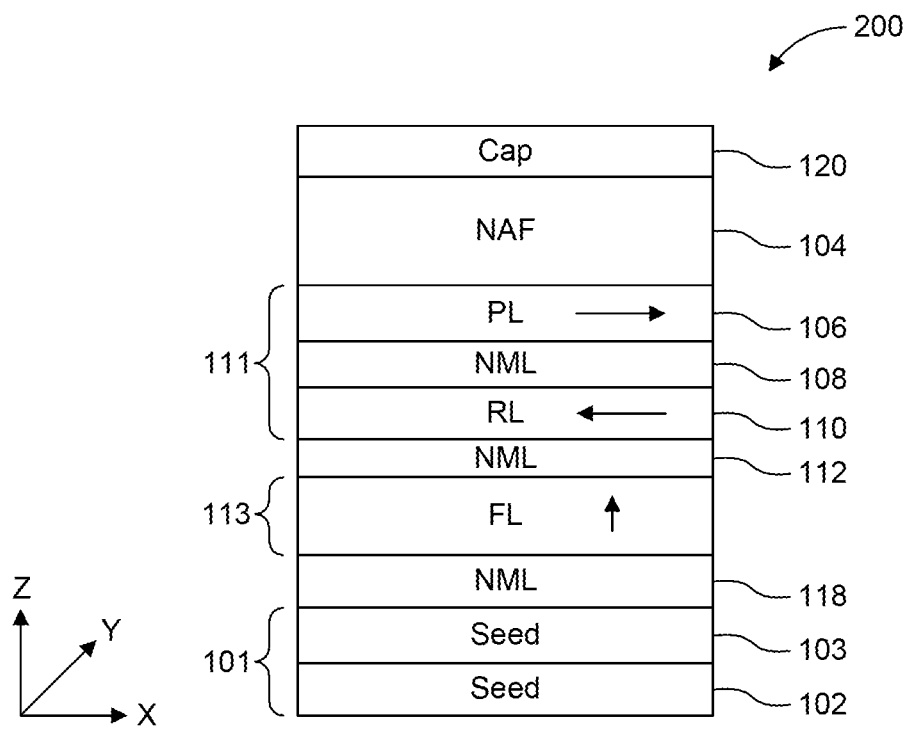
FIG. 4 shows a vertical cross-section of another GMR stack according to one or more embodiments.

FIG. 4 shows a different build-up of the magnetic layer stack 200 of the magnetoresistive sensor, where firstly the non-magnetic layer 118 is deposited (on a substrate) and after that the remaining stack is deposited. In this case the stack is called "top-pinned spin-valve" (TSV), since the reference system 111 is on the top portion of the stack. The NAF layer 104 is also on the top side of the stack (i.e., deposited on top of the reference system 111).

The order of layers of the magnetic layer stack 200 is essentially reverse to the magnetic layer stack 100 shown in FIG. 3, with the exception of the seed layer 102 and the cap layer 120, which are similarly disposed in both arrangements. In addition, a seed layer 101 in FIG. 4 includes a bi-layer arrangement of two seed layers or two sub-seed layers 102 and 103.

Figure 5A:
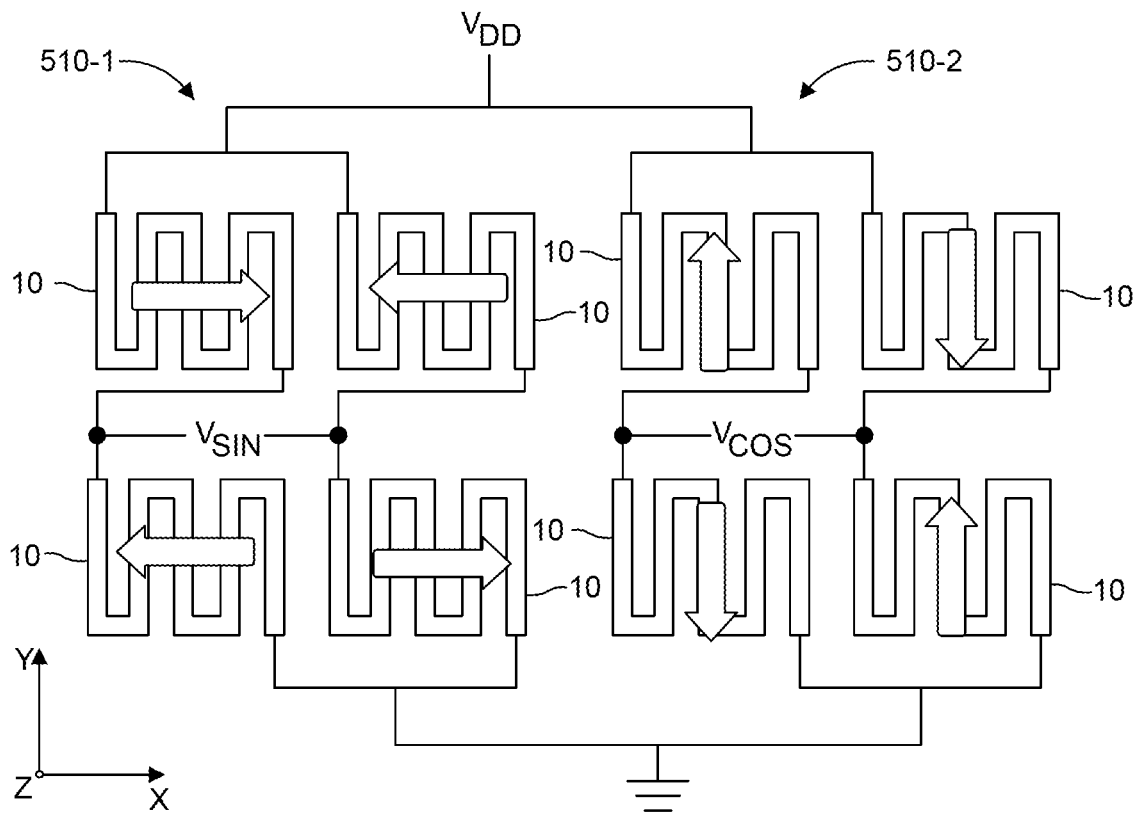
FIG. 5A shows a schematic diagram of a GMR/TMR-angle sensor having a free layer with perpendicular magnetic anisotropy in a Wheatstone full-bridge configuration for angle sensing according to one or more embodiments.

FIG. 5A shows a schematic diagram of a GMR/TMR-angle sensor 500 having a free layer with PMA in a Wheatstone full-bridge configuration for angle sensing according to one or more embodiments. The sensor 500 is capable of measuring the field strength of an external magnetic field and includes two full Wheatstone bridges 510-1 and 510-2. Each Wheatstone bridge includes four resistors (i.e., xMR elements), and each resistor includes a sensor layer (i.e., a free layer) exhibiting a perpendicular magnetic anisotropy. The Wheatstone bridges 510-1 and 510-2 are based on magneto-resistive structures 10 used as resistors arranged in a bridge configuration. Each magneto-resistive structure 10 includes a magnetic free layer 113 (not illustrated in FIG. 5A) with perpendicular magnetic anisotropy.

In addition, each of the Wheatstone bridges 510-1 and 510-2 is coupled in between a terminal for a supply voltage VDD and a terminal for a ground potential. The Wheatstone bridge 510-1 is designed to be responsive to an external magnetic field having a magnetic field component along a first direction while the Wheatstone bridge 510-2 is designed to be sensitive to an external magnetic field having a magnetic field component along a second direction perpendicular to the first direction. For instance, the first direction may be an x-direction, while the second direction being perpendicular to the first direction may be a y-direction.

The arrows indicate the in-plane magnetization of the reference layer of the reference system of a spin-valve type GMR/TMR sensor stack. Thus, the magnetization of each reference layer in bridge 510-1 are aligned with the x-direction (i.e., in either the positive or negative x-direction), and the magnetization of each reference layer in bridge 510-2 are aligned with the y-direction (i.e., in either the positive or negative y-direction). Thus, each resistor in bridge 510-1 is sensitive to magnetic fields having a Bx component and each resistor in bridge 510-2 is sensitive to magnetic fields having a By component.

The free layer magnetization in each resistor is aligned along an out-of-plane axis perpendicular to the sensor plane when an external in-plane magnetic field is not present. In this example, the free layer magnetization in each resistor is in the z-direction. Furthermore, the free layer magnetization in each resistor of bridge 510-1 and bridge 510-2 is configured to pivot or tilt towards the sensor plane as described in conjunction with FIG. 1. Thus, in the presence of the same external magnetic field, the vector of the FL magnetization of each resistor pivots in the same direction with the same tilt angle θ.

Here, the FL magnetization in each resistor of bridge 510-1 and bridge 510-2 behaves in the same manner, while the sensed field component is different in the resistors of each bridge due to different reference magnetization axes aligned in the x- and y-directions. Thus, the resistance of the resistors of bridge 510-1 changes from its default resistive value when the vector of the FL magnetization has an x-directional component. Otherwise, the resistance reverts to its default resistive value when no Bx field is present. Similarly, the resistance of the resistors of bridge 510-2 changes from its default resistive value when the vector of the FL magnetization has a y-directional component. Otherwise, the resistance reverts to its default resistive value when no By field is present.

Each Wheatstone bridge includes an sensor output configured to output an output signal. Specifically, Wheatstone bridge 510-1 is configured to generate an output signal Vsin, representative of a sine wave, and Wheatstone bridge 510-2 is configured to generate an output signal Vcos, representative of a cosine wave. Output signal Vcos is phase-shifted 90° from output signal Vsin due to the orientation of the reference layer magnetizations of the sensor in Wheatstone bridge 510-2 being shifted 90° from the orientation of the reference layer magnetizations of the sensor in Wheatstone bridge 510-1. That is, the y-axis to which the reference layer magnetizations of the sensor in Wheatstone bridge 510-2 are aligned is shifted 90° from the x-axis to which the reference layer magnetizations of the sensor in Wheatstone bridge 510-1 are aligned. This shift in reference layer magnetizations produces phase-shifted output signals.

Figure 5B:
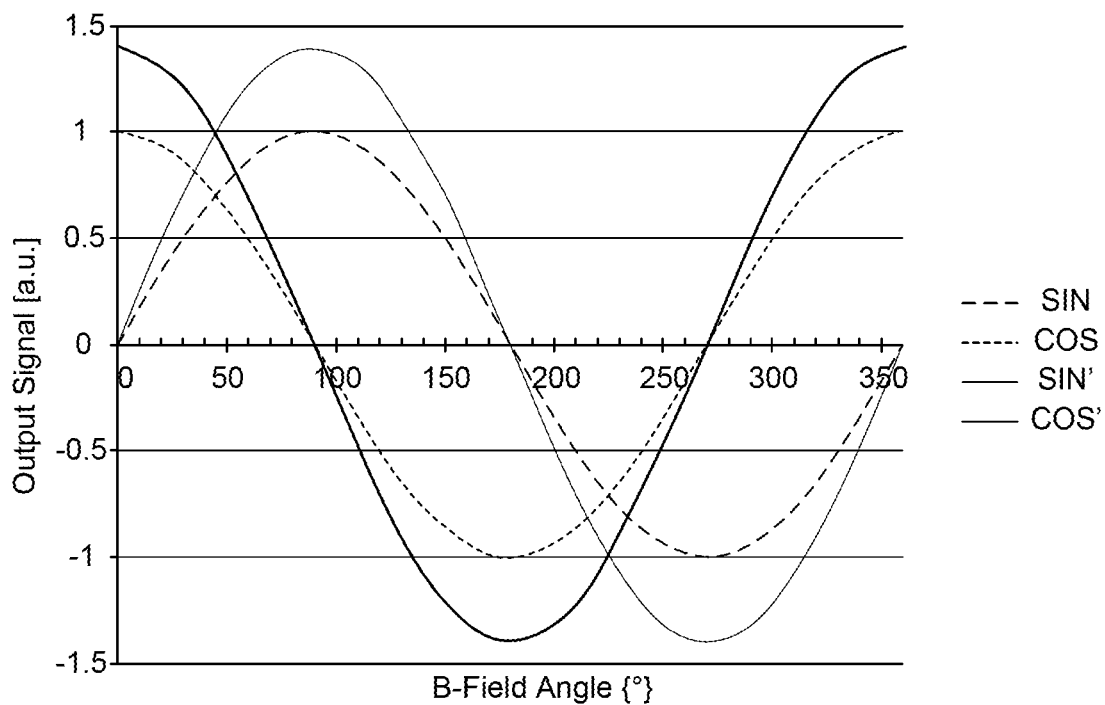
FIG. 5B shows a graph of example output signals of the sensor structure shown in FIG. 5A when exposed to an external rotation magnetic field according to one or more embodiments.

Upon applying a rotating magnetic field to the sensor 500, the full bridges generate sinusoidal differential output signals with 90° phase shift, as shown in FIG. 5B. The amplitudes of the output signals depend on the strength of the rotating B-field. By applying an ARCTAN-calculation of the Sin-signal and the Cos-signal, the angle of the external B-field can be determined.

FIG. 5B shows a graph of example output signals of the sensor structure shown in FIG. 5A when exposed to an external rotation magnetic field according to one or more embodiments. Specifically, the output signals (SIN and COS) represented in dashed lines represent an output of the sensor structure exposed to rotating B-fields with one field strength, and the output signals (SIN' and COS') represented in solid lines represent an output of the sensor structure exposed to rotating B-fields' with an increased field strength. Here, the magnitudes of the output signals (SIN' and COS') are greater than the output signals (SIN and COS) due to the increased field strength impinging on the sensor. Thus, the sensor is configured not only to measure the angle of the external rotation magnetic field, but also the field strength of the B-field applied to the sensor.

For example, the extrema of output signals (SIN' and COS') are greater than the extrema of the output signals (SIN and COS). However, the magnitudes at other angles are also larger for the output signals (SIN' and COS') when compared to the output signals (SIN and COS) at the same angle. Thus, the sensor can determine the field strength for each angle of the B-field.

A static disturbance magnetic field in combination with a rotating magnetic field of constant field strength may result in the modulation of the vector length of a sinus- and cosine-bridge signal. The signal swing and phase of the modulation may allow the sensor to determine the direction and/or the strength of the static disturbance magnetic field.

In another example, two GMR/TMR angle sensors each having the configuration of sensor 10 illustrated in FIG. 1 are arranged spatially separated to an external B-field source. The sensors are then exposed to rotating B-fields with different magnetic field amplitudes (strengths). In a gradiometer operating mode, it is possible to cancel out the influence of static/dynamic disturbance fields using this technique.

Figure 6:
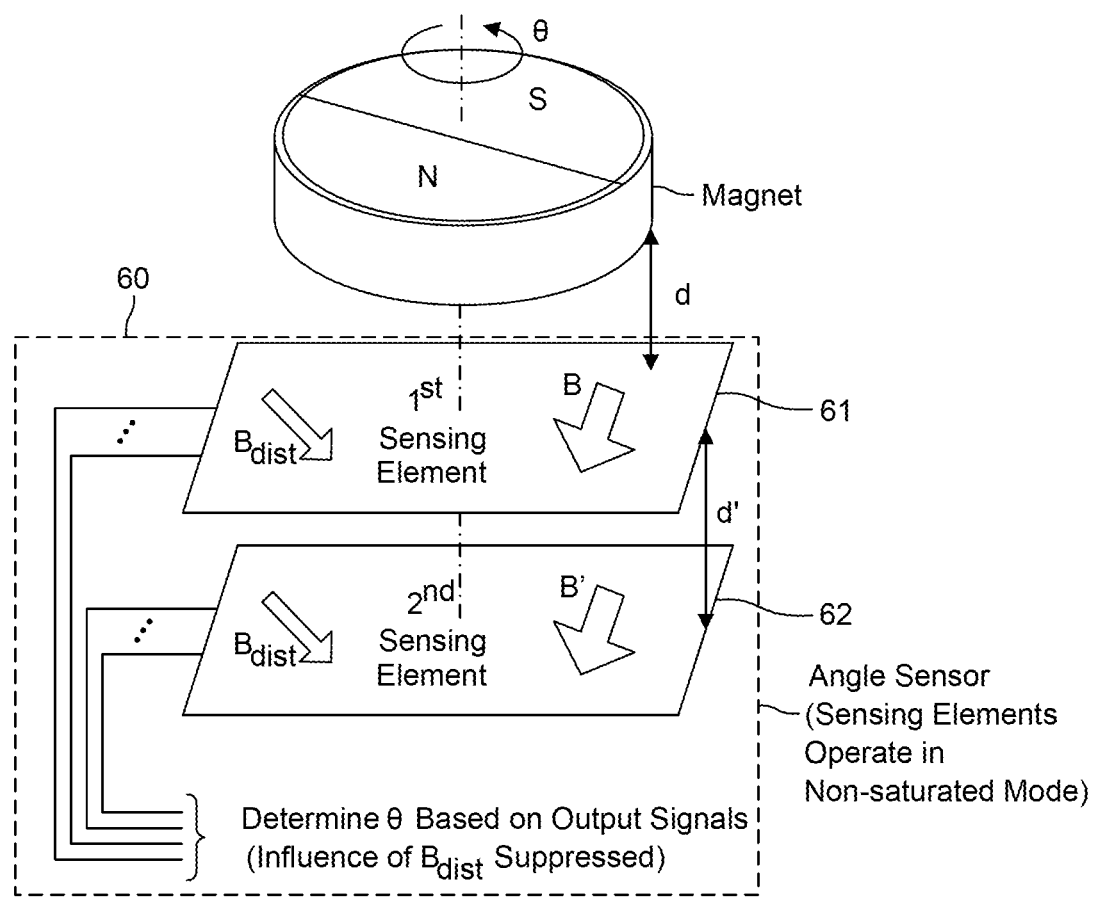
FIG. 6 is a schematic diagram of a sensor arrangement according to one or more embodiments.

In particular, FIG. 6 is a schematic diagram of a sensor arrangement according to one or more embodiments. As shown in FIG. 6, a magnet (e.g., mechanically connected to a rotatable object) may rotate about an axis (e.g., an axis through a center of the magnet) and produce a rotating magnetic field. As shown, an angle sensor 60, associated with measuring an angle of rotation ($\theta$) of the magnet, may include a first sensing element 61 and a second sensing element 62 each have a configuration similar to sensor 10 illustrated in FIG. 1.

As shown, the first sensing element 61 may be arranged substantially on a plane at a first distance (d) from a surface of the magnet such that a first in-plane component of the rotating magnetic field (B) is present at the first sensing element. In some implementations, the first sensing element 61 may be substantially centered on the axis of rotation of the magnet. As further shown, an in-plane component of a disturbance magnetic field (Bdist) is also present at the first sensing element 61. As shown, the first sensing element 61 may output a first set of output signals, the amplitudes of which depend on a strength of B and a strength of Bdist (i.e., the first sensing element 61 may operate in a non-saturated mode).

As further shown, the second sensing element 62 may be arranged substantially on a plane at a second distance (d+d') from the surface of the magnet such that a second in-plane component of the rotating magnetic field (B') is present at the second sensing element 62. Here, a strength of B' is less than the strength of B since the distance d+d' is greater than the distance d. In some implementations, the second sensing element 62 may be substantially centered on the axis of rotation of the magnet. As further shown, Bdist is also present at the second sensing element 62. As shown, the second sensing element 62 may output a second set of output signals, the amplitudes of which depend on the strength of B' and the strength of Bdist (i.e., the second sensing element may operate in a non-saturated mode).

As further shown, the angle sensor 60 may determine the angle $\theta$ based on the first set of output signals and the second set of output signals. For example, the angle sensor 60 may calculate differences in amplitude between the first set of output signals and corresponding output signals in the second set of output signals, and determine the angle $\theta$ based on the calculated differences. Determination of the angle $\theta$ in this manner may suppress, eliminate, and/or cancel the influence of Bdist from the angular measurement, thereby improving accuracy of the angle sensor.

An angle sensor structure according to any of the described embodiments may be monolithically integrated into an integrated circuit technology to enable signal conditioning and/or processing of the sensor signals.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A magnetoresistive sensor having a sensor plane in which the magnetoresistive sensor is sensitive to a magnetic field, the magnetoresistive sensor comprising:
a reference layer having a reference magnetization that is fixed and that is aligned with an in-plane axis of the sensor plane; and
a magnetic free layer disposed proximate to the reference layer, the magnetic free layer having a free layer magnetization aligned along an out-of-plane axis that is out-of-plane to the sensor plane, wherein the free layer magnetization is configured to tilt away from the out-of-plane axis and towards the sensor plane in a presence of an external in-plane magnetic field.

2. The magnetoresistive sensor of claim 1, wherein the magnetic free layer exhibits perpendicular magnetic anisotropy.

3. The magnetoresistive sensor of claim 1, wherein the free layer magnetization is aligned along the out-of-plane axis in the absence of any external magnetic field applied to the magnetic free layer.

4. The magnetoresistive sensor of claim 1, wherein the magnetic free layer has an intrinsic magnetic anisotropy that aligns the free layer magnetization along the out-of-plane axis in the absence of any external magnetic field applied to the magnetic free layer.

5. The magnetoresistive sensor of claim 1, wherein the out-of-plane axis is perpendicular to the sensor plane.

6. The magnetoresistive sensor of claim 1, wherein the free layer magnetization is configured to pivot between the out-of-plane axis and the sensor plane based on a field strength of the external in-plane magnetic field.

7. The magnetoresistive sensor of claim 6, wherein the out-of-plane axis is perpendicular to the in-plane axis.

8. The magnetoresistive sensor of claim 1, wherein an angle between the out-of-plane axis and the free layer magnetization increases as a field strength of the external in-plane magnetic field increases.

9. The magnetoresistive sensor of claim 1, wherein the external in-plane magnetic field is an external rotating magnetic field.

10. The magnetoresistive sensor of claim 1, wherein the magnetoresistive sensor is configured to generate a sensor output based on an orientation of the external in-plane magnetic field and a field strength of the external in-plane magnetic field.

11. The magnetoresistive sensor of claim 10, wherein an amplitude of the sensor output depends on the field strength of the external in-plane magnetic field.

12. The magnetoresistive sensor of claim 11, wherein the amplitude of the sensor output is directly proportional to the field strength of the external in-plane magnetic field.

13. The magnetoresistive sensor of claim 10, wherein the amplitude of the sensor output depends on a field strength of a magnetic field component of the external in-plane magnetic field that is acting along the in-plane axis.

14. The magnetoresistive sensor of claim 1, wherein the external in-plane magnetic field has an in-plane magnetic field component acting along the in-plane axis.

15. The magnetoresistive sensor of claim 1, wherein the magnetic free layer has a thickness of 1.4 nm or less.

16. The magnetoresistive sensor of claim 1, wherein the magnetic free layer has a thickness of 0.9 nm or less.

17. A magnetoresistive sensor having a sensor plane in which the magnetoresistive sensor is sensitive to an external in-plane magnetic field, comprising:
a first sensor arrangement comprising a first plurality of sensor elements, wherein each of the first plurality of sensor elements comprise:
a first reference layer having a first reference magnetization that is fixed and that is aligned with a first in-plane axis of the sensor plane; and
a first magnetic free layer disposed proximate to the first reference layer, the first magnetic free layer having a first free layer magnetization aligned along an out-of-plane axis; and
a second sensor arrangement comprising a second plurality of sensor elements, wherein each of the second plurality of sensor elements comprise:
a second reference layer having a second reference magnetization that is fixed and that is aligned with a second in-plane axis of the sensor plane, wherein the second in-plane axis is perpendicular to the first in-plane axis; and
a second magnetic free layer disposed proximate to the second reference layer, the second magnetic free layer having a second free layer magnetization aligned along the out-of-plane axis.

18. The magnetoresistive sensor of claim 17, wherein:
the first free layer magnetization of each of the first plurality of sensor elements and the second free layer magnetization of each of the second plurality of sensor elements are configured to tilt away from the out-of-plane axis and towards the first in-plane axis in a presence of the external in-plane magnetic field having a first magnetic field component that acts along the first in-plane axis, and
the first free layer magnetization of each of the first plurality of sensor elements and the second free layer magnetization of each of the second plurality of sensor elements are configured to tilt away from the out-of-plane axis and towards the second in-plane axis in a presence of the external in-plane magnetic field having a second magnetic field component that acts along the second in-plane axis.

19. The magnetoresistive sensor of claim 17, wherein the out-of-plane axis is perpendicular to the sensor plane.

20. The magnetoresistive sensor of claim 17, wherein:
the first sensor arrangement is configured to generate a first sensor output based on an orientation and a field strength of the external in-plane magnetic field, and
the second sensor arrangement is configured to generate a second sensor output based on the orientation and the field strength of the external in-plane magnetic field.

* * * * *